United States Patent

Nagata et al.

Patent Number: 5,470,777
Date of Patent: Nov. 28, 1995

[54] METHOD OF FABRICATING RANDOM ACCESS MEMORY DEVICE HAVING SIDEWALL INSULATING LAYER ON THE LAMINATE STRUCTURE

[75] Inventors: Toshiyuki Nagata, Tsukuba; Hiroyuki Yoshida, Ryugasaki; Takayuki Niuya, Tsukuba, all of Japan

[73] Assignee: Texas Instruments Incorporated, Dallas, Tex.

[21] Appl. No.: 248,830

[22] Filed: May 25, 1994

Related U.S. Application Data

[63] Continuation of Ser. No. 135,866, Oct. 13, 1993, abandoned, which is a continuation of Ser. No. 882,783, May 14, 1992, abandoned.

[30] Foreign Application Priority Data

May 24, 1991 [JP] Japan ........................... 3-149755

[51] Int. Cl.⁶ ........................... H01L 27/00; H01L 21/70
[52] U.S. Cl. ........................... 437/52; 437/41; 437/47; 437/48; 437/228
[58] Field of Search ........................... 437/41, 47, 52, 437/60, 225, 228; 156/643, 653; 257/900, 905

[56] References Cited

U.S. PATENT DOCUMENTS

| | | | |
|---|---|---|---|
| 4,826,781 | 5/1989 | Asahina et al. | 437/41 |
| 4,997,790 | 3/1991 | Woo et al. | 437/228 |
| 5,037,777 | 8/1991 | Mele et al. | 437/228 |
| 5,158,910 | 10/1992 | Cooper et al. | 437/228 |
| 5,162,884 | 11/1992 | Liou et al. | 257/384 |
| 5,198,386 | 3/1993 | Gonzalez | 437/52 |
| 5,200,352 | 4/1993 | Pfiester | 437/44 |

*Primary Examiner*—Olik Chaudhuri
*Assistant Examiner*—H. Jey Tsai
*Attorney, Agent, or Firm*—William E. Hiller; Richard L. Donaldson

[57] ABSTRACT

A semiconductor device in which a bit line (41), which is adhered to a contact hole (49) between polysilicon gate electrodes (35) and (36), is directly connected with an $SiO_2$ film (53) having the same pattern on the gate electrodes; wherein an $Si_3N_4$ layer (56) is buried outside the contact areas between the gate electrodes to approximately the same height as the $SiO_2$ layer (53). The interlayer insulating film of the conventional memory cells array unit is no longer required, and it is not necessary to form contact holes in the interlayer insulating film. As a result, even if the gaps between the gates are designed to be small, there will be no short-circuiting between the bit line and word lines due to mask shifting, etc., making it possible to offer a highly integrated, highly reliable device.

8 Claims, 19 Drawing Sheets

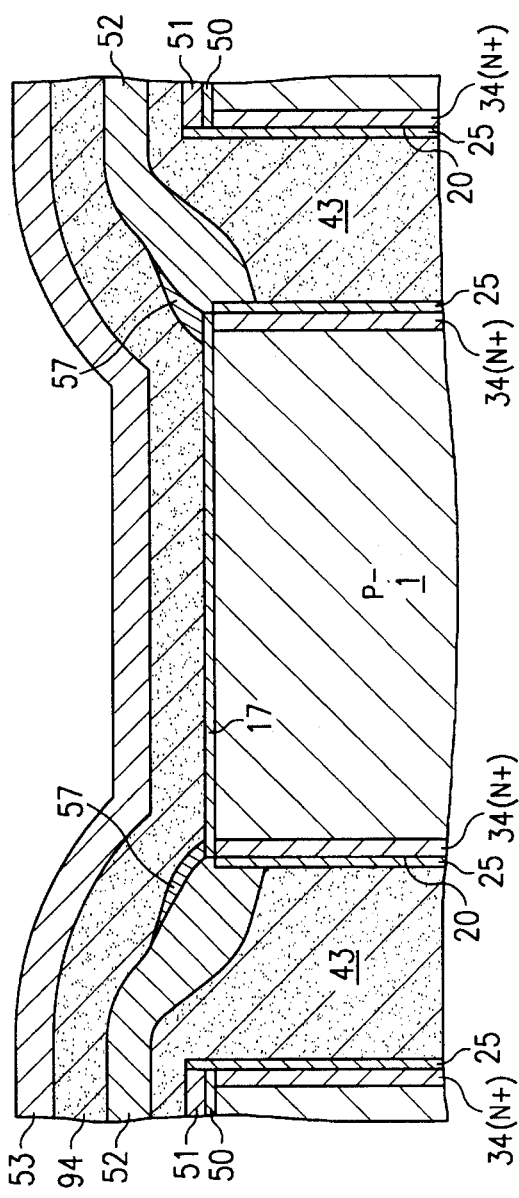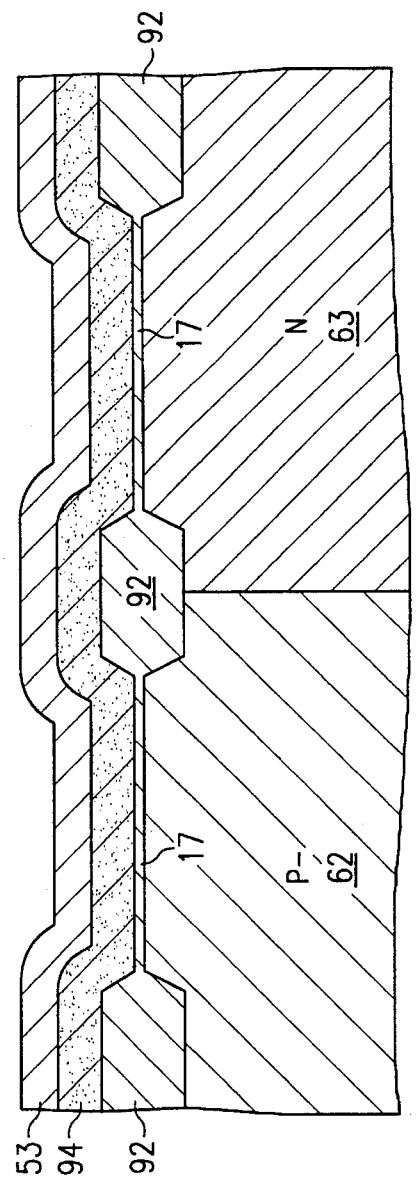
FIG. 10A
FIG. 10B

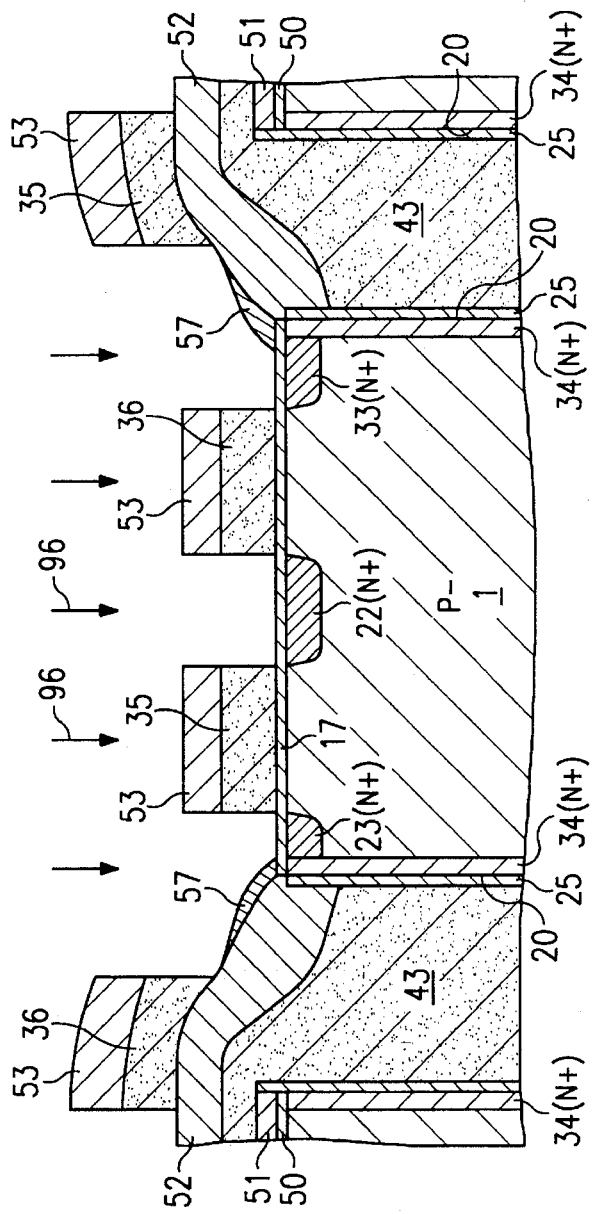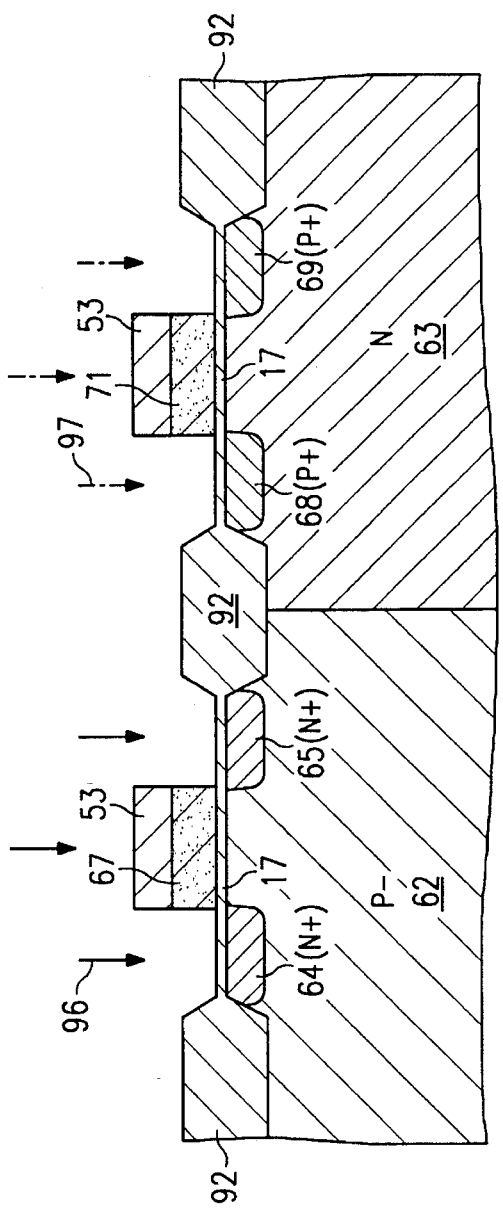
FIG. 11A
FIG. 11B

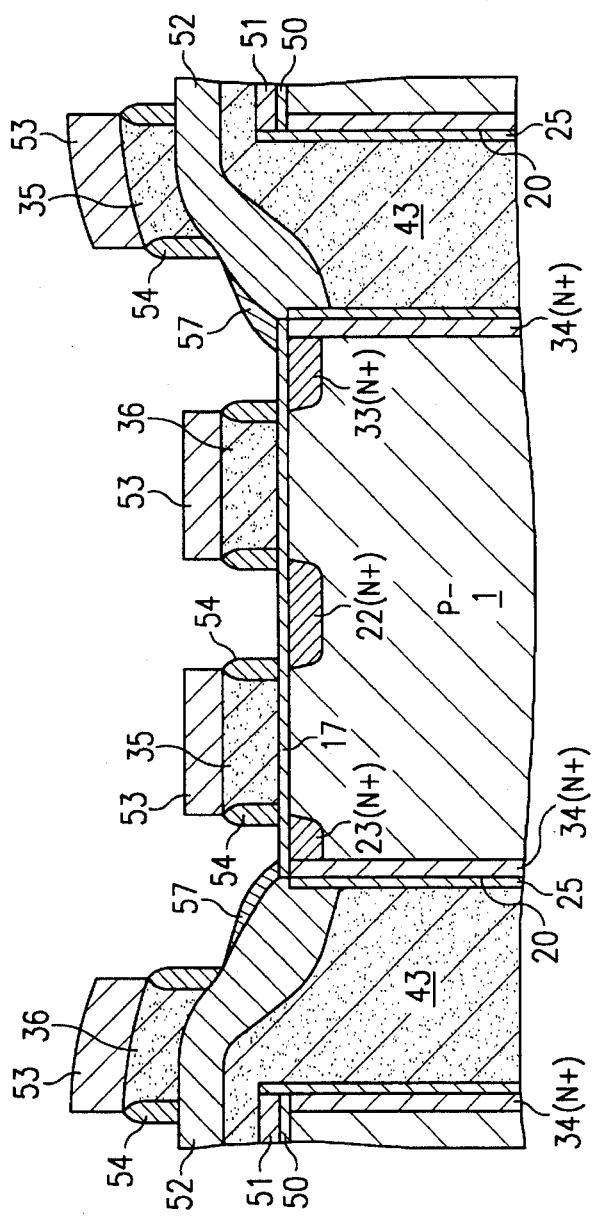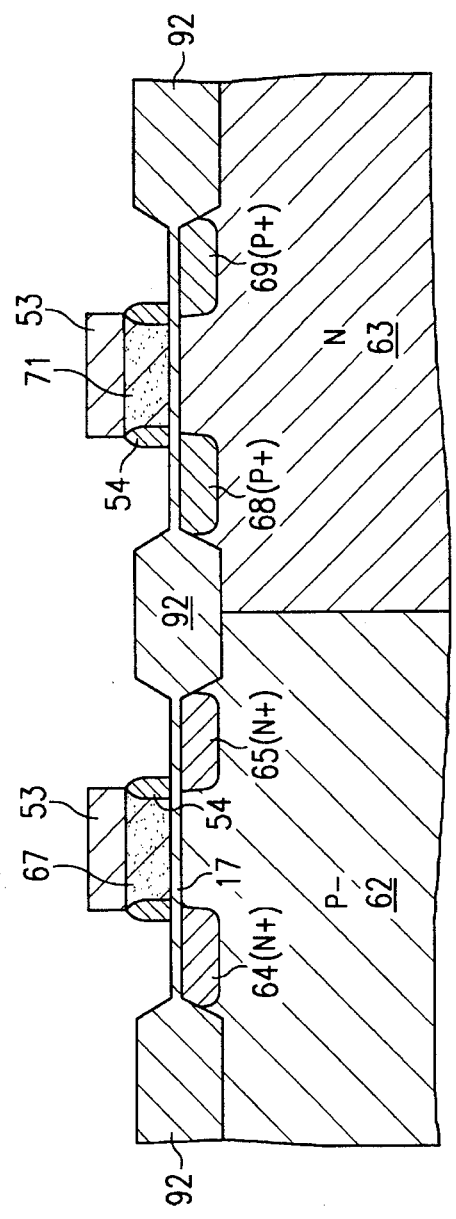
FIG. 12A
FIG. 12B

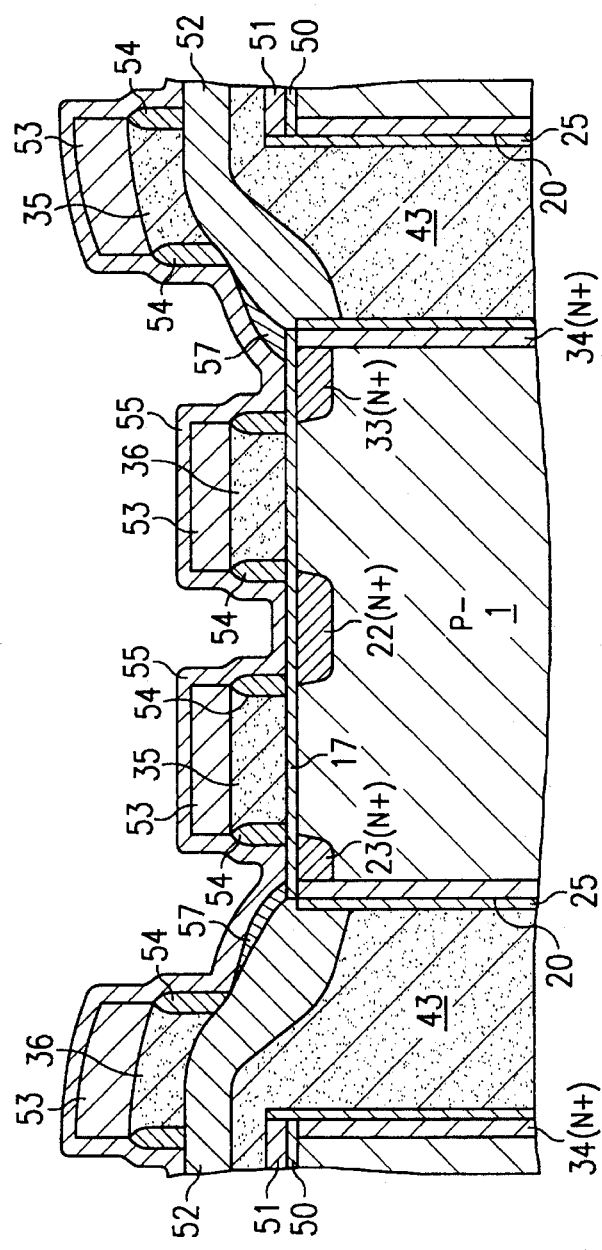
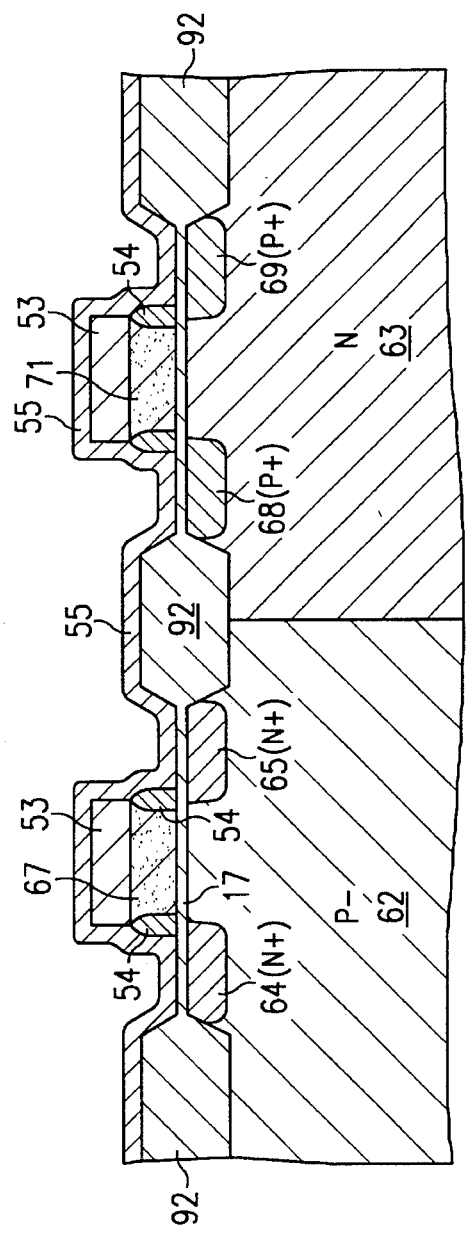
FIG. 13A
FIG. 13B

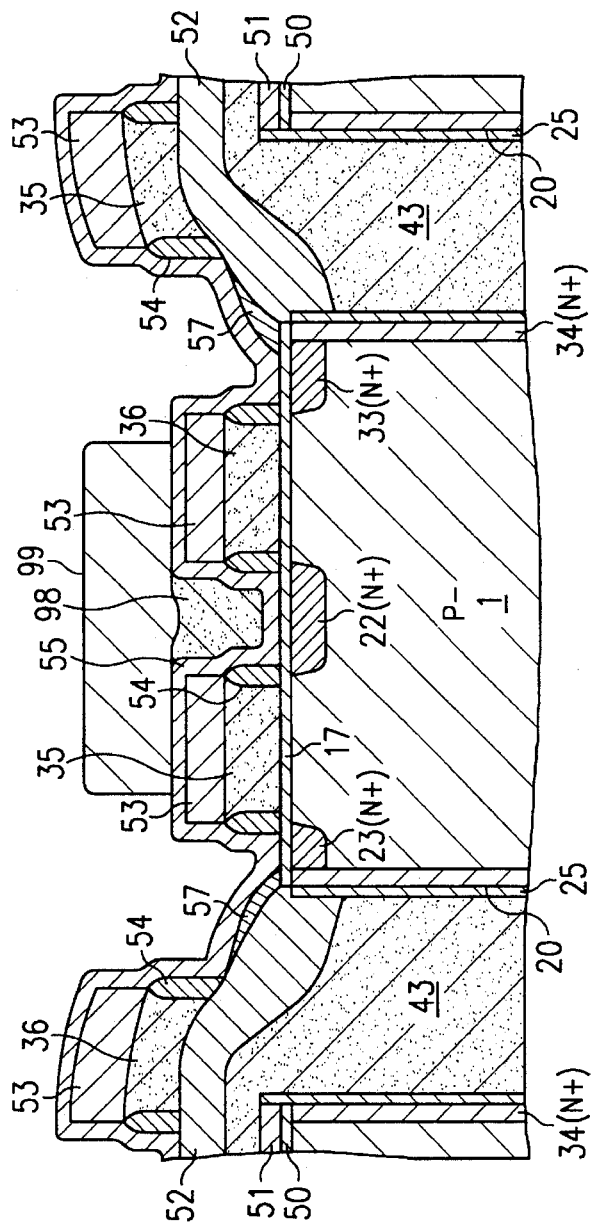
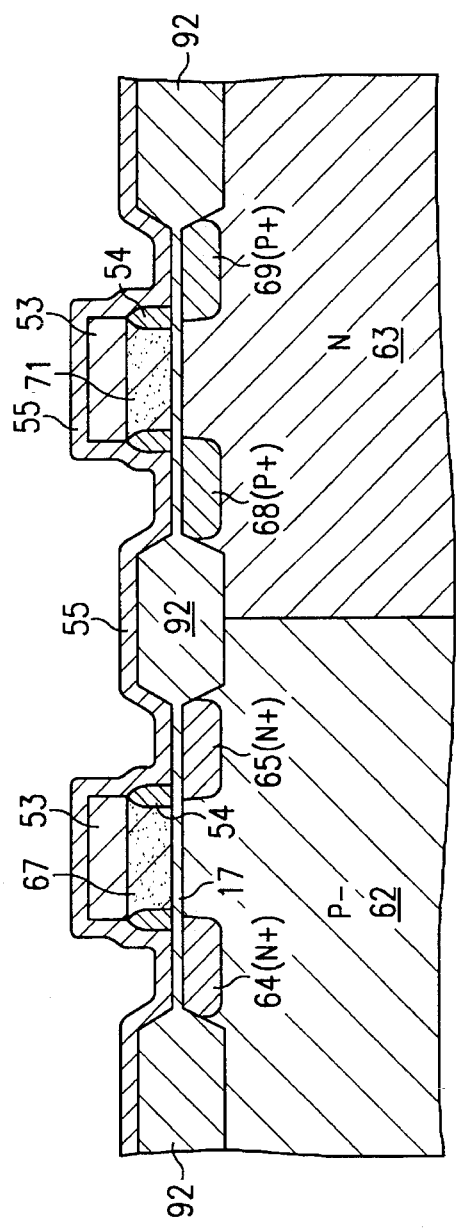
FIG. 15A
FIG. 15B

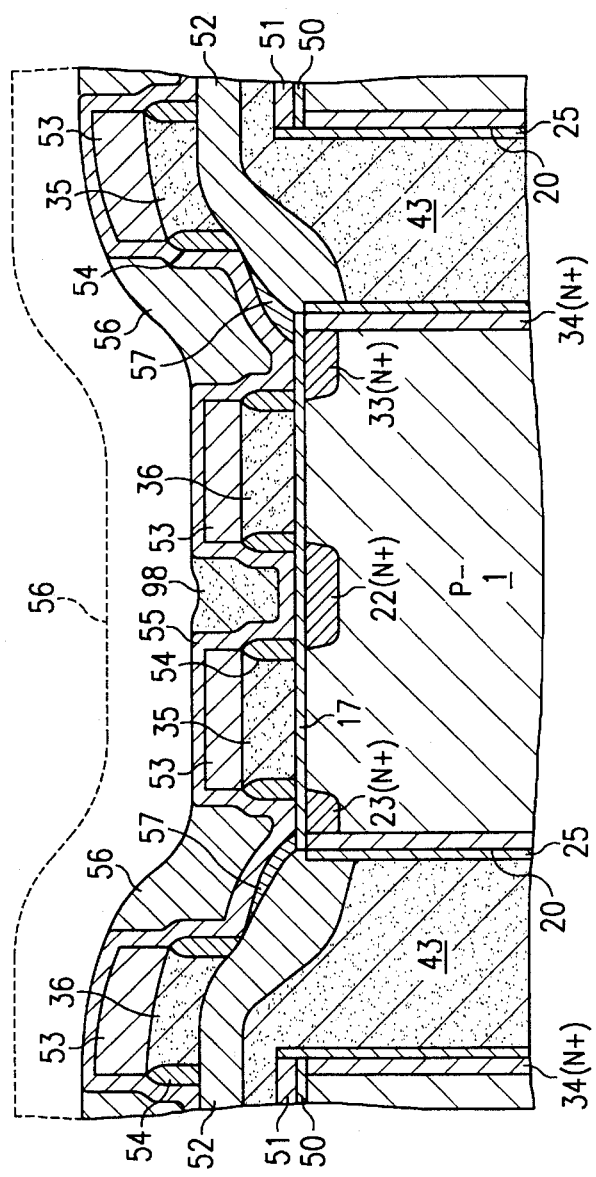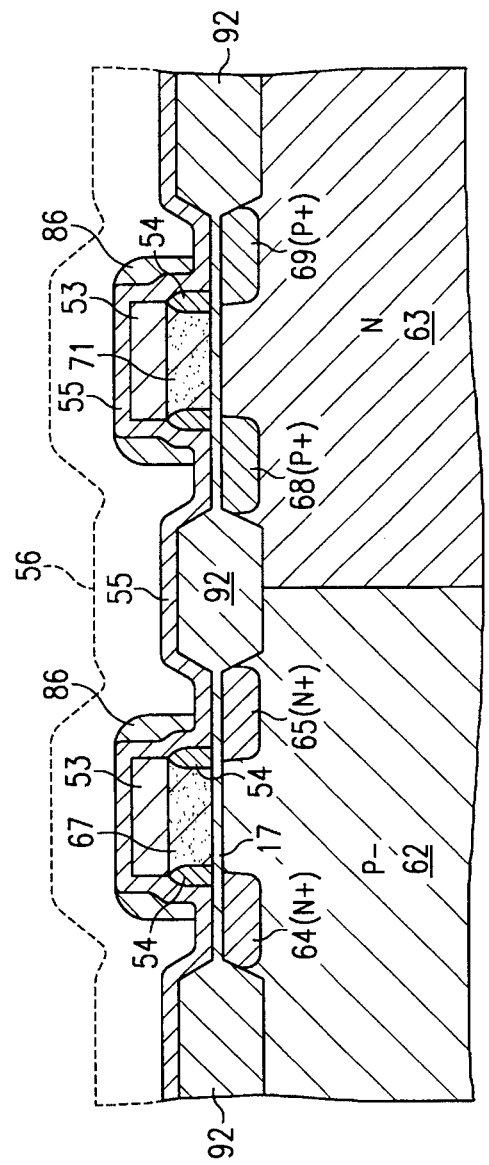
FIG. 16A
FIG. 16B

1

METHOD OF FABRICATING RANDOM ACCESS MEMORY DEVICE HAVING SIDEWALL INSULATING LAYER ON THE LAMINATE STRUCTURE

This application is a continuation of application Ser. No. 08/135,866, filed Oct. 13, 1993, abandoned which is a continuation of application Ser. No. 07/882,783, filed May 14, 1992, abandoned.

The present invention pertains to a semiconductor device, such as a dynamic RAM (Random Access Memory), and a method for manufacturing it.

PRIOR ART

As shown in FIG. 19, conventionally, in a dynamic RAM, for example, $n^+$-type impurity diffusion areas (2), (3), and (4) are formed on a $p^-$-type semiconductor substrate (actually a $p^-$-type well) (1). The area (2) is connected to a bit line, while the areas (3) and (4) are connected to a capacitance (not shown). In the figure, (5) and (6) are polysilicon gate electrodes (word lines) which form transfer gates; (7) is a gate insulating film; and (8) is an interlayer insulating film used to isolate the elements.

With this type of memory cell array unit, when a contact hole (9) is formed in order to connect the bit line and $n^+$-type area (2), the interlayer insulating film (8) (having a thickness of 1.0 μm, for example) is installed to be considerably thicker than the word lines (5) and (6) (having a thickness of 0.6 μm, for example). A photoresist (10) is used as a mask in etching a prescribed pattern to remove the area in dashed lines, thereby forming the contact hole (9).

However, as integration increases, the distance between the elements (and hence the distance between the word lines) is further reduced, and may be designed to be extremely small, such as 0.4 μm.

Thus, since the distance between the word lines is extremely small, when light exposure is used in forming the mask (10), the pattern of the mask will inevitably shift. Specifically, as shown by A in FIG. 20, when the mask (10) shifts in position, the word line (6) is exposed inside the contact hole (9). If the connected bit line (shown as (11) by the alternate long and short dash line) makes contact with the Word line (6), both of them will short-circuit.

On the other hand, as shown in FIGS. 21–22, there is a method in which the difference between $Si_3N_4$ and $SiO_2$ in terms of etching selectivity ratio is utilized. Specifically, as shown in FIG. 21, before the interlayer insulating film ($SiO_2$) (8) is etched, $Si_3N_4$ layers (11) and (12) are situated on the top and side of the word lines (5) and (6) (the layer (12) is referred to as a side wall). Next, as shown in FIG. 22, the interlayer insulating film (8) is etched using the photoresist (10) as a mask, thereby forming the contact hole (9).

With this method, since the etching speed of the interlayer insulating film ($SiO_2$) (8) is related to the etching speed of the $Si_3N_4$ layers (11) and (12) in a ratio of approximately 3:1, only the interlayer insulating film (8) should be selectively etched. However, in actual practice, unless the etching selectivity ratio is sufficiently large, an $Si_3N_4$ layer (11) (or (12)) will also be etched, as shown in B of FIG. 22. As a result, the bit line (11), which is covered by the contact hole (9), will make contact with a word line (such as (5)) and cause short-circuiting.

OBJECT OF THE INVENTION

An object of the present invention is to provide a highly reliable semiconductor device and its manufacturing method with which it is not necessary to be concerned with mask shifting or the etching selectivity ratio during the manufacturing process, and with which short-circuiting does not occur even with increased integration.

SUMMARY OF THE INVENTION

Specifically, the present invention relates to a semiconductor device comprising:

a first, second and third laminates, which are obtained by sequentially forming a first insulating film on top of a semiconductor substrate, a conductive film on top of the insulating film, and a Second insulating film on top of the conductive film;

diffusion areas formed on the surface of the semiconductor between the first laminate and second laminate;

a third insulator, which is buried between laminates other than the first laminate and second laminate;

and a second conductive layer, which is formed on top of the second insulating film of the first, second, and third laminates, and is connected with the diffusion areas.

In addition, the present invention relates to a method for manufacturing a semiconductor device comprising the steps of:

forming a first, second, and third laminates by sequentially forming a first insulating film on top of a semiconductor substrate, a conductive film on top of the insulating film, and a second insulating film on top of the conductive film;

forming diffusion areas on the surface of the semiconductor between the first laminate and second laminate;

forming a fourth insulating film on the sides of the laminates and between the laminates;

burying a material having a higher etching rate than the fourth insulating film (especially 10–20 times higher; preferably infinitely higher) between the first laminate and second laminate;

burying a third insulator between laminates other than the first and second laminate;

a first etching performed on the material which is buried between the first laminate and second laminate;

a second etching the fourth insulating film, which is formed between the first laminate and second laminate, is removed, thereby exposing the diffusion areas; and forming a second conductive layer on top of the second insulating film of the first, second, and third laminates, to connect with the diffusion areas.

BRIEF DESCRIPTION OF THE DRAWINGS

FIGS. 10 and 10B are cross sections of the major parts which shows a step in the method for manufacturing the aforementioned RAM IC.

FIGS. 11 and 11B are cross sections of the major parts which shows a step in the method for manufacturing the aforementioned RAM IC.

FIGS. 12 and 12B are cross sections of the major parts which shows a step in the method for manufacturing the aforementioned RAM IC.

FIGS. 13 and 13B are cross sections of the major parts which shows a step in the method for manufacturing the aforementioned RAM IC.

FIGS. 15 and 15B are cross sections of the major parts which shows a step in the method for manufacturing the aforementioned RAM IC.

FIGS. 16 and 16B are cross sections of the major parts which shows a step in the method for manufacturing the aforementioned RAM IC.

In reference numerals as shown in the drawings:

Figure 1:
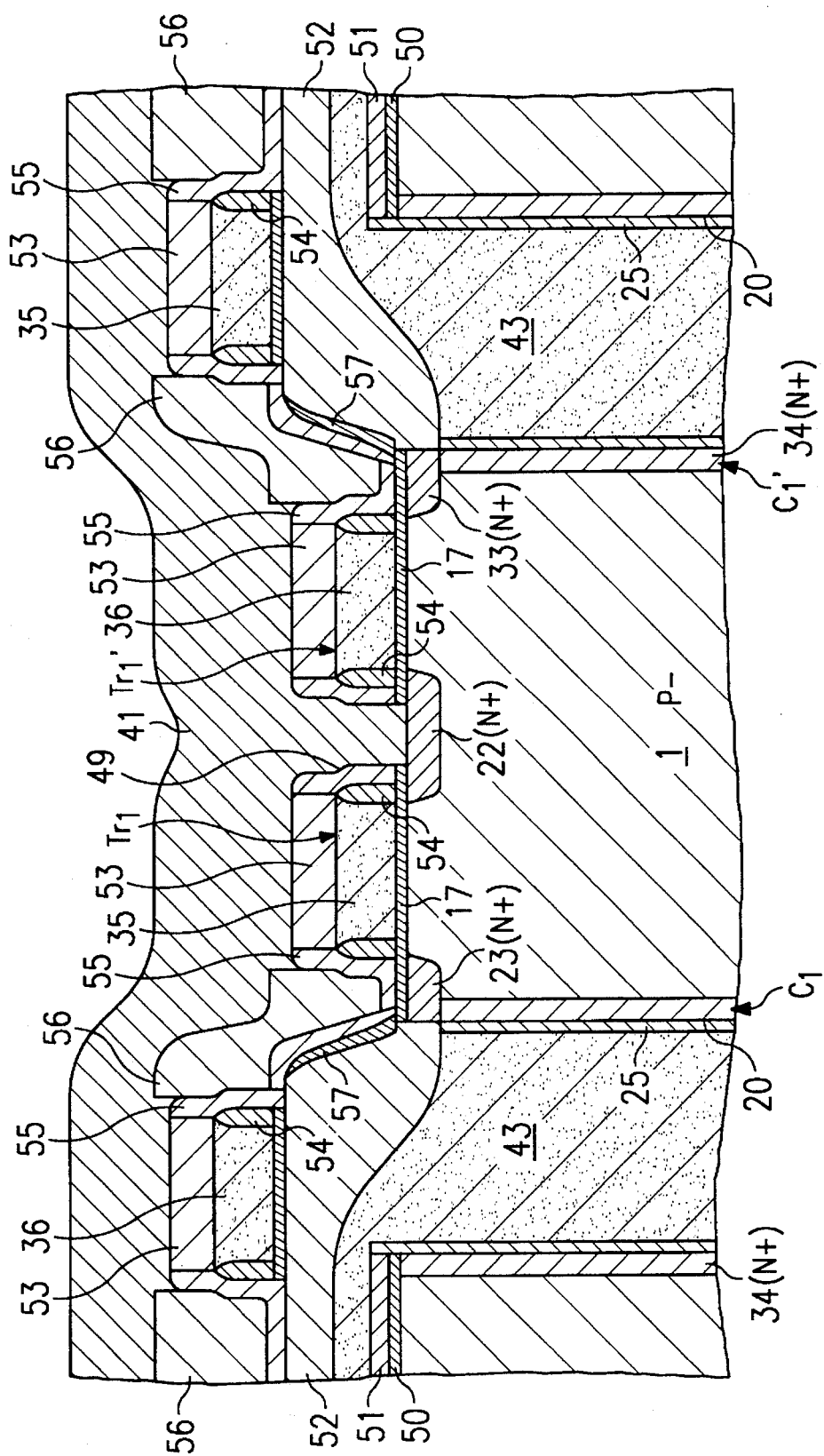
FIG. 1 is a cross section of memory cells in the dynamic RAM of the an embodiment of the present invention (cross section of the line I—I in FIG. 2).
Figure 2:
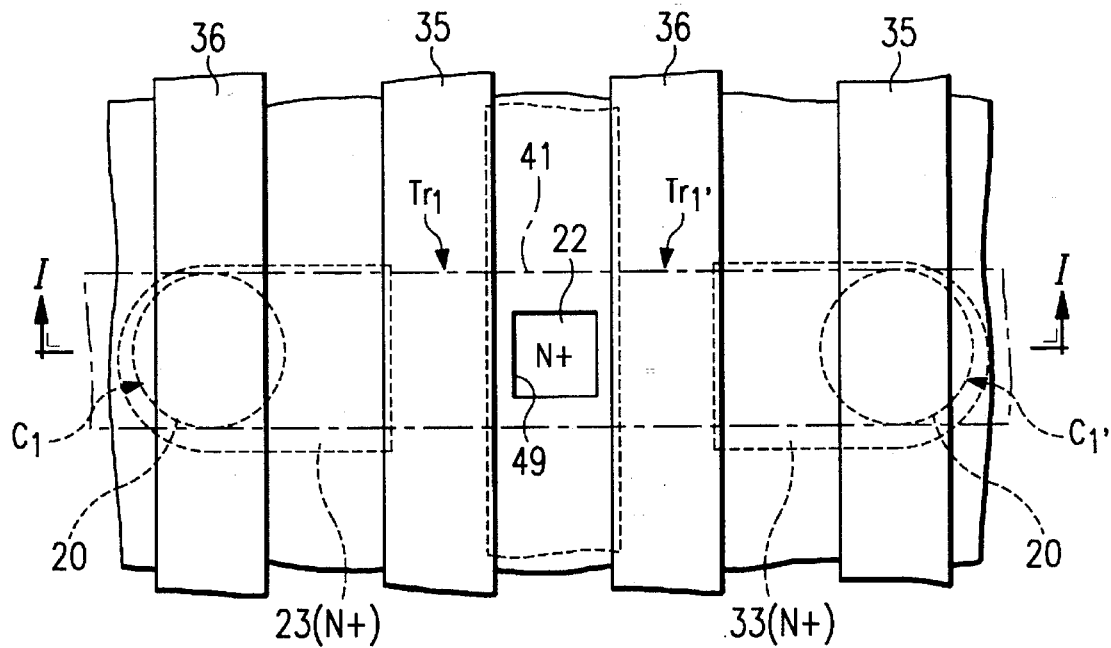
FIG. 2 is a plan view of the aforementioned memory cells.

1. $p^-$-type well
20. Trench groove
22. Drain area ($n^+$-type diffusion area)
23, 33. Source areas ($n^+$-type diffusion areas)
25, 52, 53, 54, 55. $SiO_2$ films or $SiO_2$ layers
34. $n^+$-type diffusion area
35, 36. Polysilicon gate electrodes (word lines)
41. Bit line
43. Polysilicon layer (field plate)
51, 56, 57. $Si_3N_4$ layers
$Tr_1$, $Tr$'. Transfer gates
$C_1$, $C_1$'. Capacitors
A. Memory cell array unit
B. Peripheral circuitry unit

DESCRIPTION OF THE PREFERRED EMBODIMENTS

FIGS. 1–4 show a dynamic RAM (such as a 64 megabyte) produced in embodiments of the present invention.
(0013)
With this dynamic RAM, the memory cells consist of a single transistor-single capacitor structure, comprising transfer gates $Tr_1$ and $Tr_1$', which are composed of n-channel insulation gate field effect transistors; and capacitors $C_1$ and $C_1$', which are connected to the source areas (23) and (33) of these transfer gates. The capacitors $C_1$ and $C_1$' are connected in common between adjoining cells (see FIG. 3).

Next, a trench-shaped groove (20) of a prescribed depth is formed on a main side of a $p^{--}$-type silicon substrate (40) (specifically, a $p^-$-type well (1) formed on a silicon substrate). This groove (20) is filled with an $n^+$-type polysilicon (field plate) (43) via an insulating film (25).

Next, an $n^+$-type diffusion area (34), which is diffusion-formed on the entire outside surface of the groove (20), is used as an electrode in forming the capacitors $C_1$ and $C_1$'. In addition, $n^+$-type source areas (23) and (33), which are linked to the $n^+$-type diffusion area (34), and an $n^+$-type drain area (22), which is connected to a bit line (41), are diffusion-formed on the other surface of the groove (20). Gate electrodes (35) and (36), which serve as word lines, are situated in between these areas via a gate oxide film (17), thereby connecting the n-channel insulation gate field effect transistors (transfer gates) $Tr_1$ and $Tr_1$', which are used in horizontal transmission.

Figure 3:
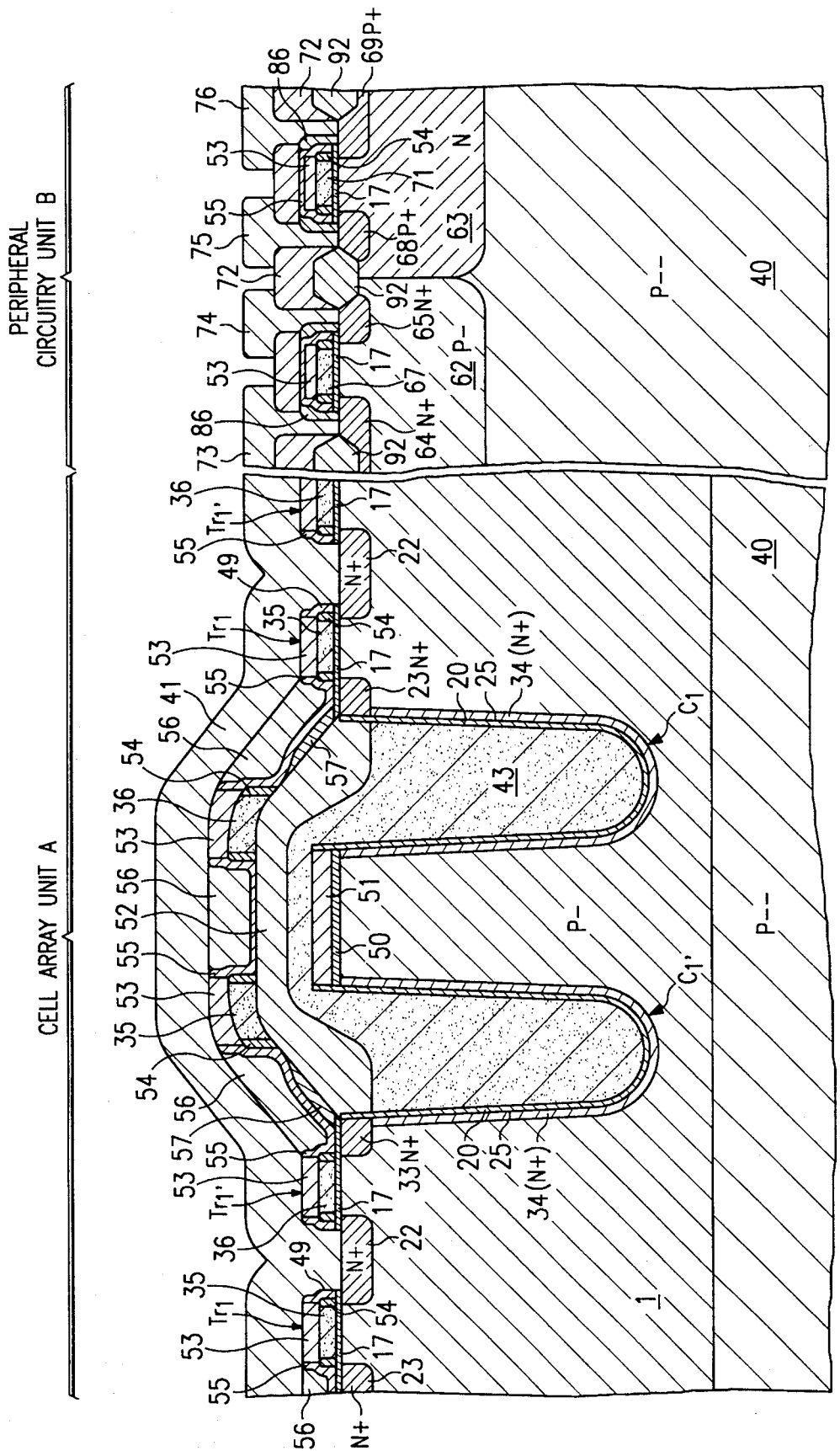
FIG. 3 is a cross sections of a RAM IC containing the aforementioned memory cells.

Two transfer gates are installed in one active area in the memory cell array unit A as shown in FIG. 3. A bit line (41) is installed to be common to both of these.

The capacitors $C_1$–$C_1$' are connected to each other between cells by a field plate (43). The bottom of this field plate is insulated and isolated by an $SiO_2$ film (50) and $Si_3N_4$ film (51). In addition, its top is insulated and isolated by an $SiO_2$ film (52).

The word lines (35) and (36) of other transfer gates are situated on top of the $SiO_2$ film (52). The $SiO_2$ (52) is attached to an $Si_3N_4$ film (57) on the cell array unit side.

In addition, an $SiO_2$ layer (53) is laminated in nearly the same pattern on top of both word lines (35) and (36). The other sides of the word lines are attached to an $SiO_2$ film (54) and $SiO_2$ film (55), thereby keeping the word lines electrically separated.

Figure 22:
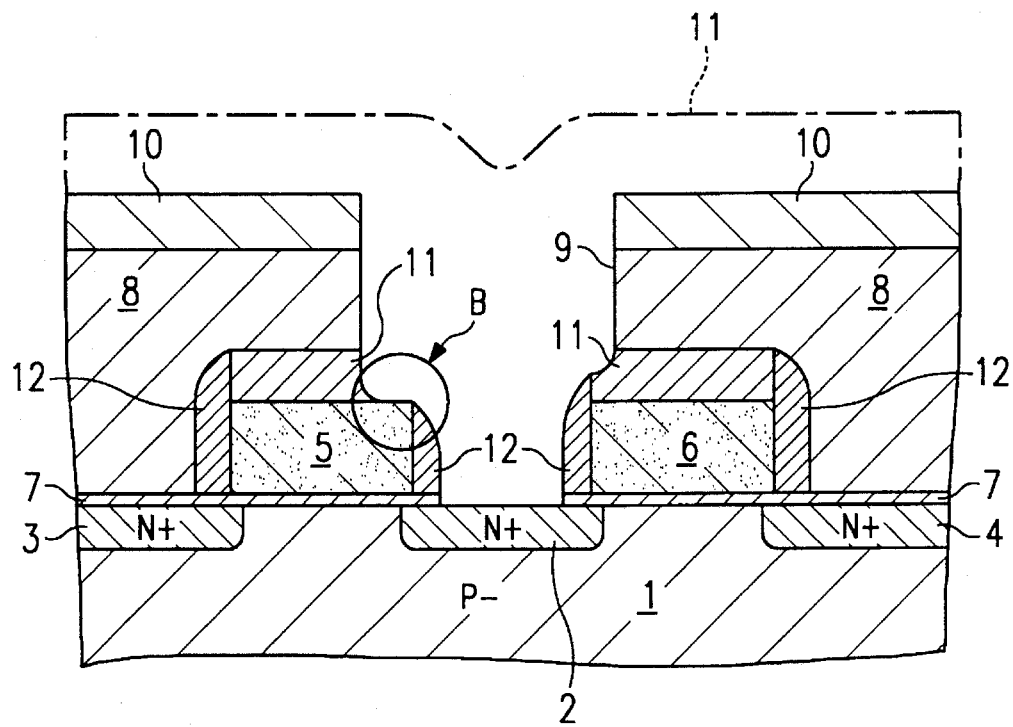
FIG. 22 is a cross section which shows a short-circuit occurring in the aforementioned memory cell unit.

In addition, the bit line (41) is connected to the $n^+$-type area (22) through a contact hole (49). An $Si_3N_4$ layer (56), having approximately the same height as the word lines, is buried between the word lines in an area away from this contact hole area. The aforementioned bit line (41) extends above the $Si_3N_4$ layer (56) and $SiO_2$ layer (53). There is no proper interlayer insulating film (such as the $SiO_2$ layer (8) in FIG. 22) between them.

Figure 4:
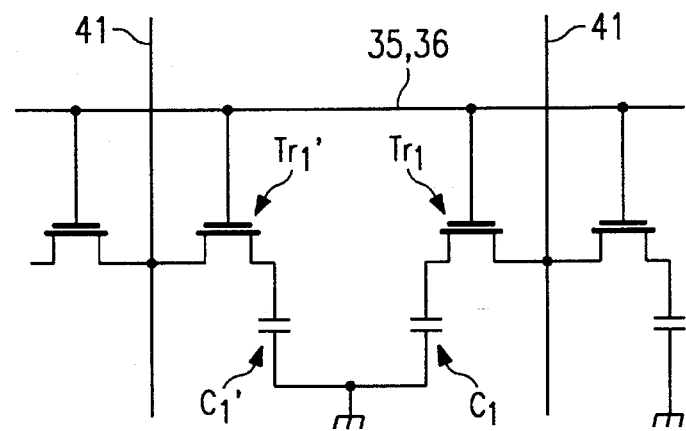
FIG. 4 is an equivalent schematic diagram of the aforementioned memory cells.

In addition, the memory cells are connected as shown in FIG. 4, being composed of one transistor Tr and one capacitor C. The capacitors $C_1$ and $C_1$' are connected in common for adjoining cells. In addition, electric potential data, which are supplied through the bit line (41), are transmitted to the capacitor by turning on the transistor Tr via the word lines (35) and (36). The potential transmitted to the capacitor is maintained by it.

In addition, as is commonly known, the peripheral circuitry B (see FIG. 3) may be formed in a CMOS structure. Each of the wells (62) and (63) contains an n-channel insulation gate field effect transistor, which consists of $n^+$-type diffusion areas (64) and (65), a gate oxide film (17), and a polysilicon gate electrode (67); and a p-channel insulation gate field effect transistor, which consists of p$^+$-type diffusion areas (68) and (69), a gate oxide film (17), and a polysilicon gate (71). In the figure, (52), (53), (54), and (55) are SiO$_2$ layers, described above; (72) is an interlayer insulating film; and (73), (74), (75), and (76) are electrodes. In addition, (86) is an Si$_3$N$_4$ layer formed by the same procedure as (56) described above.

With a device having the above structure, especially in the memory cell array unit A, since the bit line (41), which is deposited to the contact hole (49) between the polysilicon gate electrodes (35) and (36), makes direct contact with the SiO$_2$ layer (53) having the same pattern as the gate electrodes, an interlayer insulating film, such as it was used conventionally, is made unnecessary by the memory cell array unit. Thus, it is not necessary to form a contact hole in the interlayer insulating film (a contact hole should be formed between the gate electrodes using the self-alignment method described below). As a result, it is possible to offer a device which is highly reliable for designing smaller gaps between the gates, having a high degree of integration, and not subject to the short-circuits described above between bit lines and word lines due to shifting in the mask position.

In addition, since it is possible to form a contact hole (49) by etching with the self-alignment method described below, it is not necessary to use the difference between Si$_3$N$_4$ and SiO$_2$ in terms of etching speed selectivity ratio. Thus, it is possible to form the contact hole easily, and it is possible to create contacts with no short-circuiting without exposing the gate electrodes.

In addition, away from the contact areas, since the Si$_3$N$_4$ layer (56) is buried to approximately the same height as the SiO$_2$ layer (53) in between the gate electrodes, there is sufficient insulation and isolation from the bottom and it is possible to flatten the entire product, including the gate upper surface. Thus, it is possible to directly attach the bit line (41) to the Si$_3$N$_4$ layer (56) from the SiO$_2$ layer (53). If the bit line is deposited to the top of an interlayer insulating film that is very thick, as with the conventional technology, then, the bit line step coverage is insufficient on the top of the contact hole. In addition, although the thickness of the entire insulating layer on the front surface of the device also tends to be increased, in the present embodiment, the bit line (41) step coverage is good since the bit line (41) is directly attached as described above, thus making it possible to reduce the thickness of the insulating layer as a whole.

The case is the same in the gap with the word lines situated on the field plate (43). As shown in FIG. 3, Si$_3$N$_4$ layers (56) having almost the same height as the word line, are buried between the word line (36) on the field plate (43) and the gate electrode (35) which serves as a transfer gate; and between the word lines (35) and (36) on the field plate (43). Thus, it is possible to directly deposit the bit line (41) with reduced thickness and sufficient insulation separation, as described above.

The manufacturing method of the present device will now be explained with reference to FIGS. 5–18.

Figure 5:
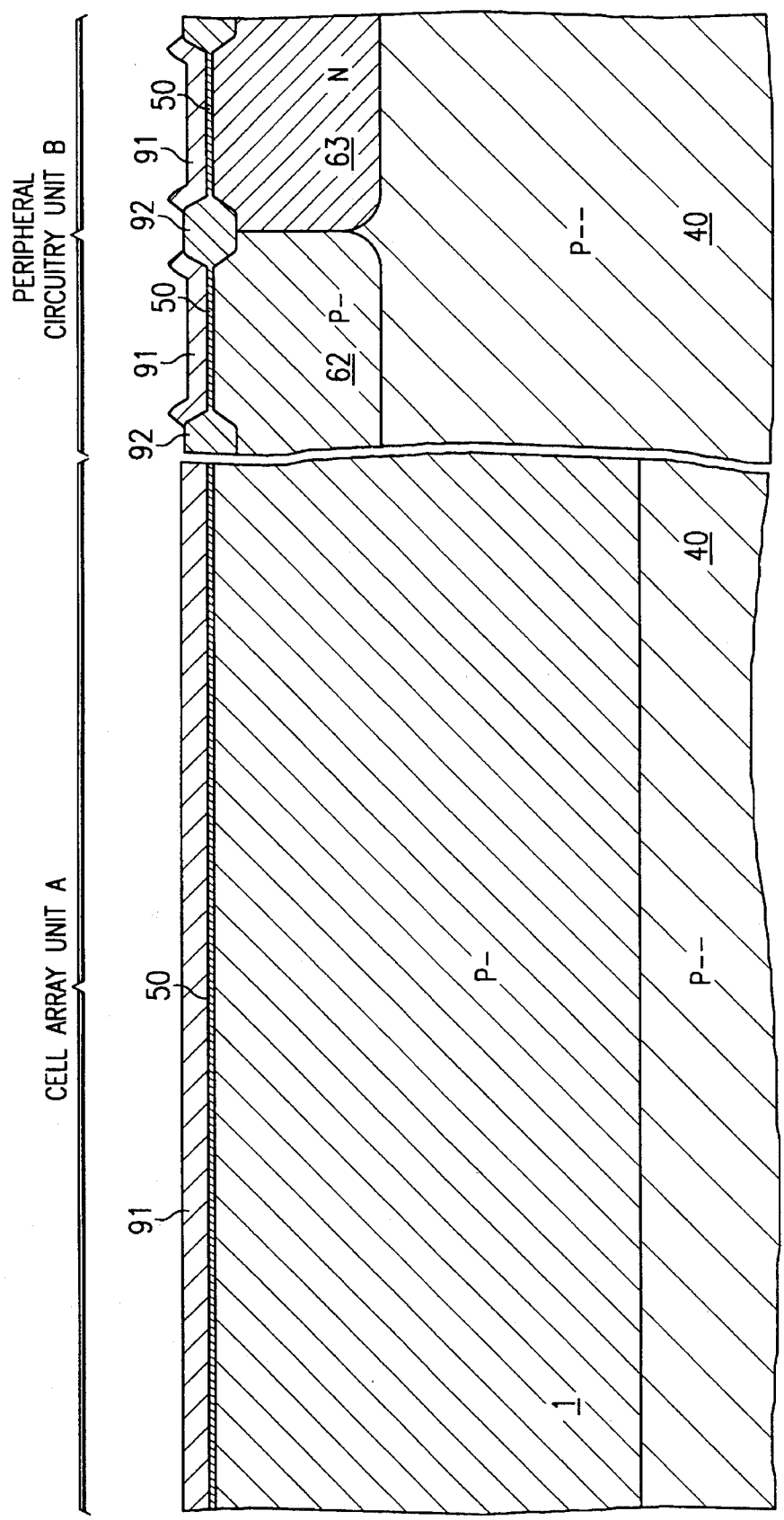
FIG. 5 is a cross sections which shows a step in the method for manufacturing the aforementioned RAM IC.

As shown in FIG. 5, in the initial stage of the process, an n-type impurity (such as As) and a p-type impurity (such as B) are alternately ion-injected in the peripheral circuitry unit B, thereby forming an n-type well (63) and a p$^-$-type well (62). In addition, ion injection of a p-type impurity is carried out in the memory cell array unit A to form a relatively deep p$^-$-type well.

Next, an SiO$_2$ film (50) and Si$_3$N$_4$ film (91) are installed (however, they are installed selectively in the peripheral circuitry), and the LOCOS (Local Oxidation of Silicon) method is used to form a field oxide film (92) for separating the elements.

Figure 6:
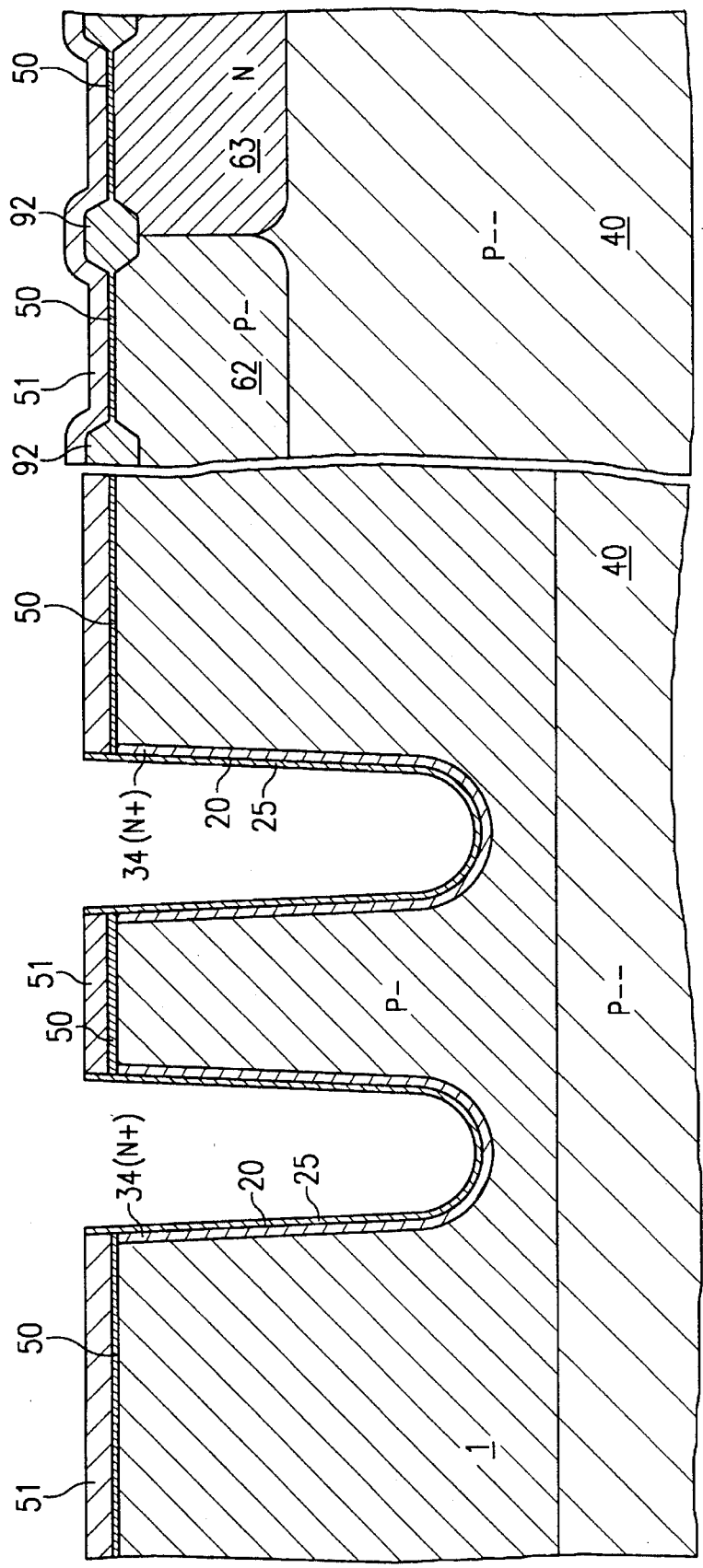
FIG. 6 is a cross section which shows a step in the method for manufacturing the aforementioned RAM IC.

Next, as shown in FIG. 6, the nitride film (91) on the surface is first removed, then a nitride film (51) is deposited, which is etched into a prescribed pattern, after which the nitride film (51) or resist is used as a mask in etching the substrate (1). Thus, a trench-shaped groove (20) with a thickness of 3–5 μm is formed on the substrate (1).

Next, a commonly known method is used to diffuse an n-type impurity (such as As) into the walls of the groove (20), thereby forming an n$^+$-type diffusion area (34) for storing the charge of the capacitor. Next, the thermal oxidation method or CVD (chemical vapor phase deposition method) is used to form SiO$_2$ films (25), having a thickness in the range of 100 Å, on the walls of the groove (20). Only one unit area is shown in the figures, including FIG. 6, but the other areas are treated in the same manner.

Figure 7:
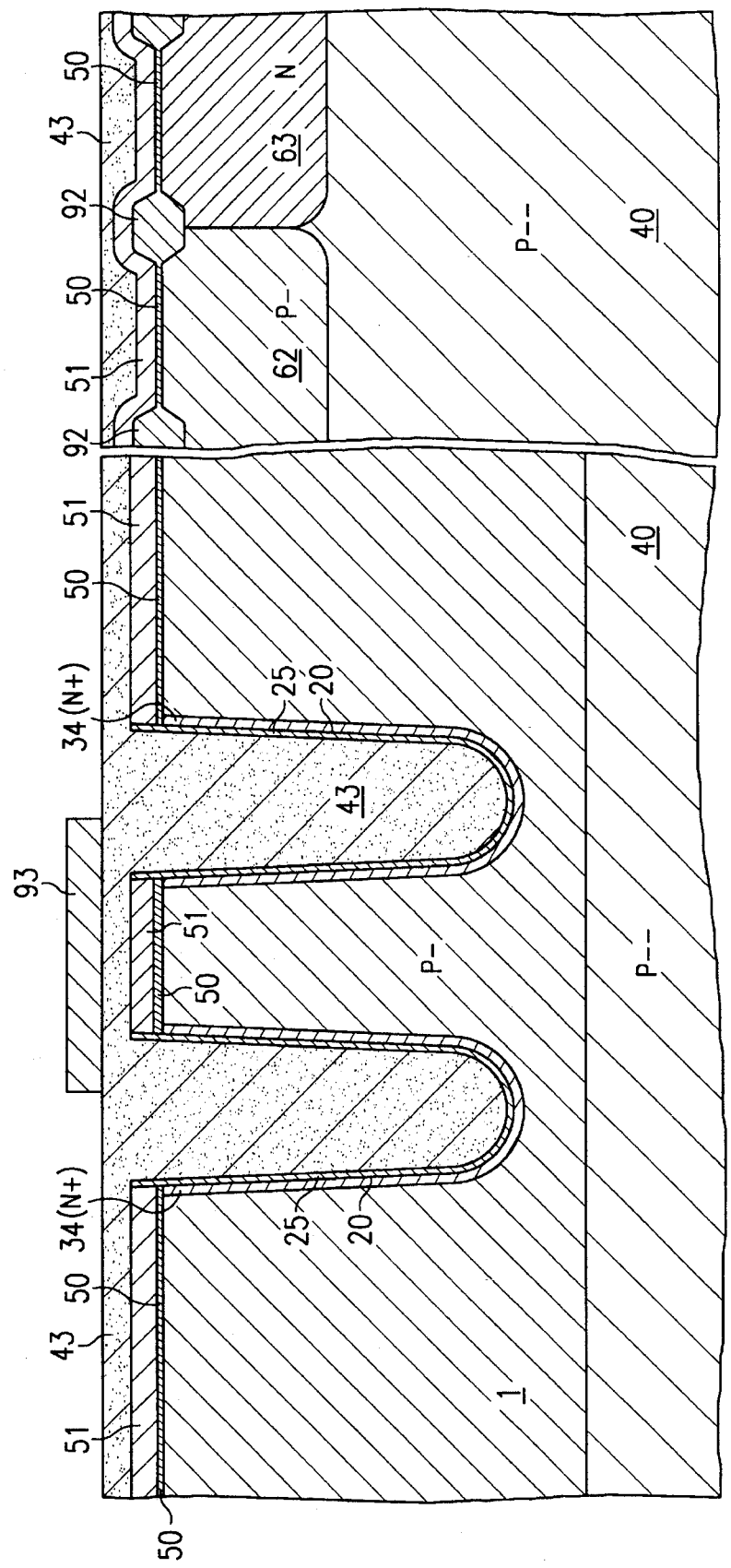
FIG. 7 is a cross section which shows a step in the method for manufacturing the aforementioned RAM IC.

Next, as shown in FIG. 7, the CVD method is used to deposit an n-type polysilicon (43) over the entire surface, including the groove (20), thereby forming a photoresist (93) in the prescribed pattern on only the prescribed areas (between the capacitors).

Figure 8:
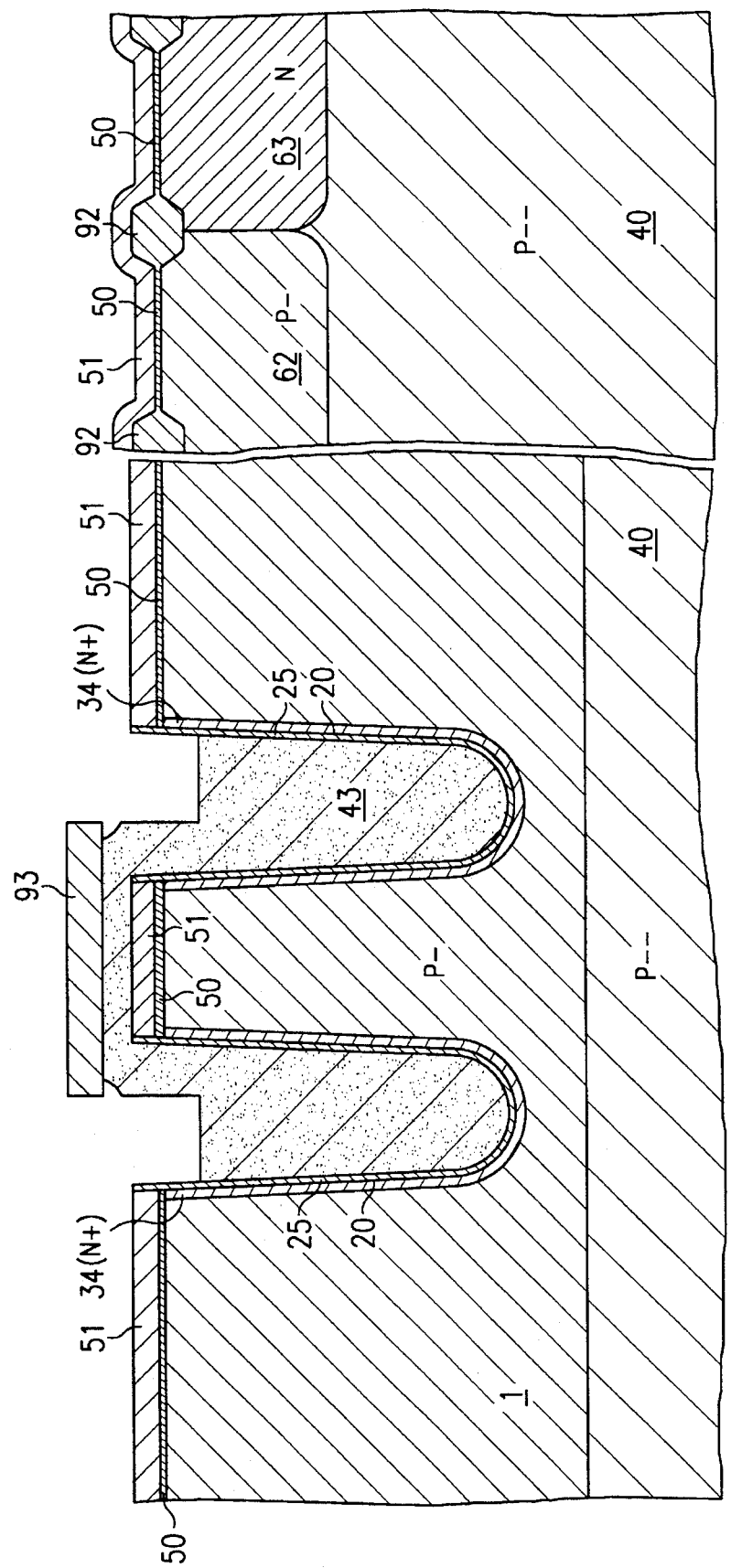
FIG. 8 is a cross section which shows a step in the method for manufacturing the aforementioned RAM IC.

Next, as shown in FIG. 8, the resist (93) is used as a mask in first wet etching the polysilicon (43), after which dry etching (RIE) is used to leave a continuous polysilicon layer (43), which serves as a field plate between adjoining grooves (20)—(20). The top of this field plate is made less steep by under etching through wet etching to remove the edge at a slant.

Figure 9:
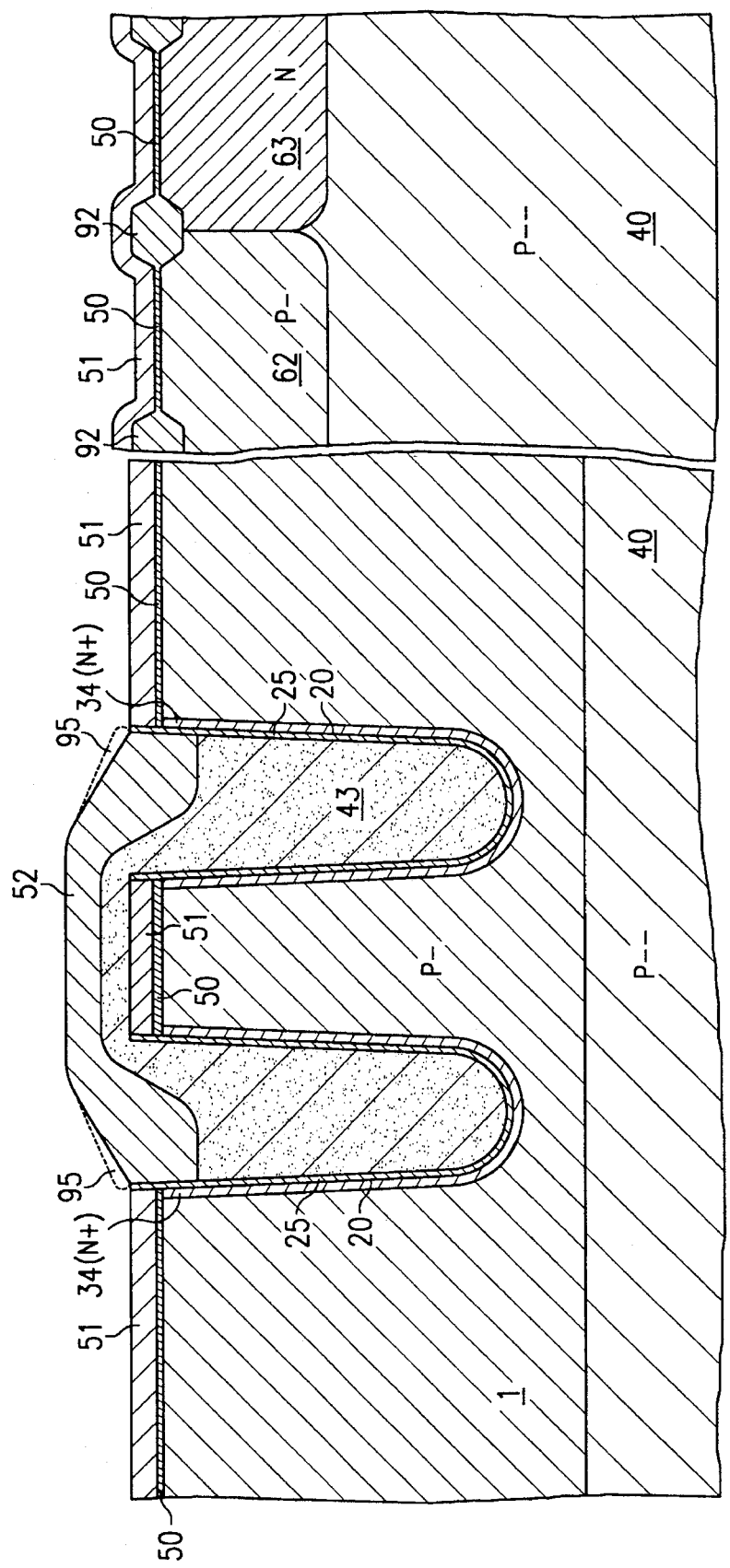
FIG. 9 is a cross section which shows a step in the method for manufacturing the aforementioned RAM IC.

Next, as shown in FIG. 9, the surface of the polysilicon layer (43) is oxidized by a thermal oxidation technology, thereby growing an SiO$_2$ layer (52). During this process, since the SiO$_2$ layer (52) may be grown such that after growth it will protrude somewhat into the periphery, before the procedure shown in FIG. 10 (before the polysilicon (94) is deposited), Si$_3$N$_4$ is deposited over the entire surface and etching technology is used to adhere the Si$_3$N$_4$ film (57) around the SiO$_2$ layer (52) as a side wall.

Specifically, after the procedure shown in FIG. 9, an Si$_3$N$_4$ film is applied over the entire surface of the memory cell array unit. Next, etching is carried out over the entire surface to selectively adhere the Si$_3$N$_4$ film (57) onto the circumference of the SiO$_2$ layer (52), as shown in FIG. 10. Thus, when a hood structure (95), resulting from the protrusion of the aforementioned SiO$_2$ layer (52), is generated as shown by the imaginary line in FIG. 9, and when a polysilicon (94) used for gates is adhered in the procedure in FIG. 10, this polysilicon reaches even below the aforementioned hood structure and thus remains unetched, thereby making it possible to prevent short-circuits between adjoining word lines.

FIG. 10 and the following figures primarily show the memory cell array unit, especially the transfer gate area, and also show the peripheral circuitry unit.

In FIG. 10, the Si$_3$N$_4$ film (51) and SiO$_2$ film (50) of FIG. 9 are removed by etching, after which a gate oxide film (17) is grown, on top of which the n-type polysilicon (94) and SiO$_2$ layer (53) are sequentially deposited by CVD.

Next, as shown in FIG. 11, the SiO$_2$ layer (53) and polysilicon layer (94) are stacked on the same pattern and etched, thereby forming laminates between the polysilicon gate electrodes (word lines) (35) and (36) and the SiO$_2$ layer (53), which are separated by a prescribed gap. In the same manner, laminates between the polysilicon gates (67) and (71) and the SiO$_2$ layer (53) in the peripheral circuitry unit are formed.

Next, n-type impurity ions (such as As) (96) are injected using the aforementioned laminates as masks, thereby forming n$^+$-type diffusion areas (22), (23), and (33) to be self-aligning inside the substrate (1). In the peripheral circuitry unit, impurity ions (96) and (97) are injected, thereby forming corresponding diffusion areas (64), (65), (68), and (69) to be self-aligning.

Next, as shown in FIG. 12, dry oxygen is used to grow the SiO₂ film (54) on the sides of the polysilicon layer (35), (36), (67), and (71) to a thickness in the range of 10–100 Å, for example 30 Å, thereby protecting the side surfaces.

Next, as shown in FIG. 13, CVD is used to deposit an SiO₂ film (55) on the entire surface. The thickness of this SiO₂ film (55) should be set in the range of 300–800 Å, for example to 500 Å.

Figure 14A:
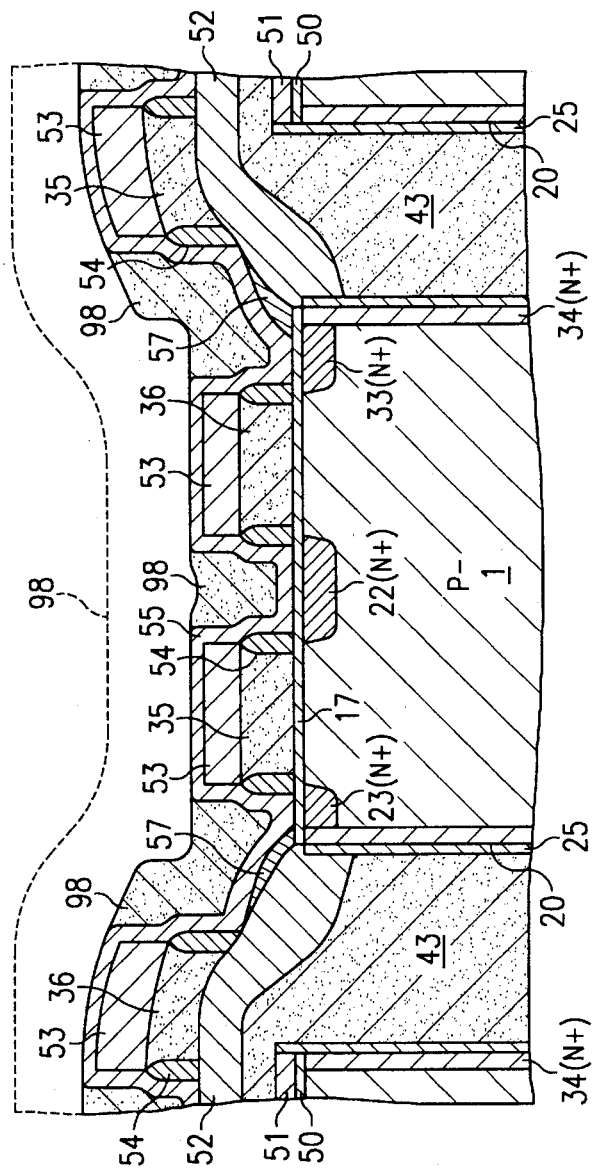
FIGS. 14 and 14B are cross sections of the major parts which shows a step in the method for manufacturing the aforementioned RAM IC.
Figure 14B:
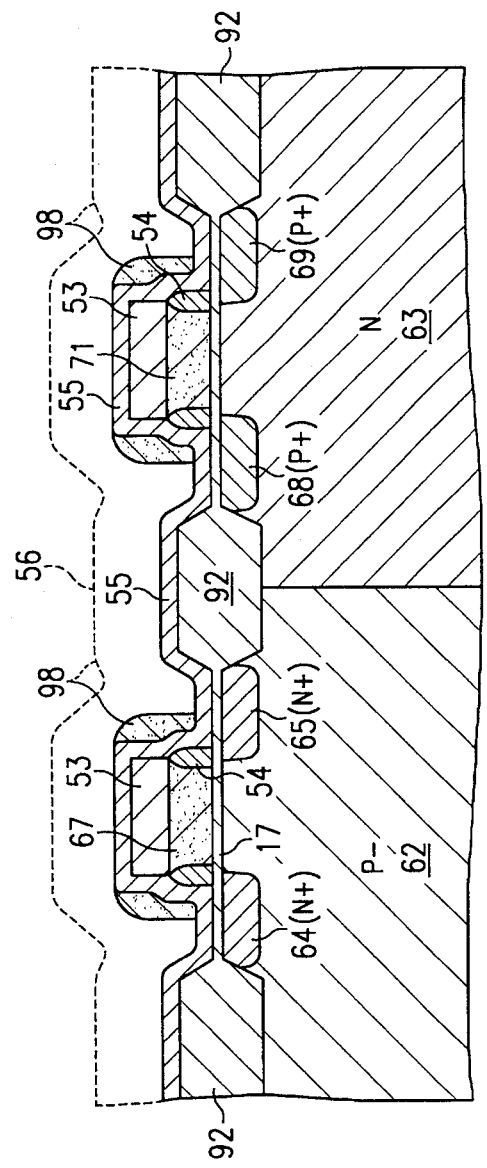

Next, as shown in FIG. 14, CVD is used to deposit a polysilicon (98) up to the level shown by the dashed line. Next, an etching back technology involving dry etching is used to etch the polysilicon (98), thereby allowing the polysilicon (98) to remain between the gates at approximately the same height as the gates (combined height of the gate electrodes (35) and (36) and SiO₂ layer (53)). During this etching back procedure, the polysilicon (98) has good step coverage and etching control is good (etching speed of polysilicon is 10–15 times faster than with the SiO₂ film (55)). Thus, it is possible to allow it to remain at all times at the targeted thickness (height). In the peripheral circuitry unit, the polysilicon (98), following the etching back procedure, is covered to the side surfaces of the gate, thereby remaining as side walls. Thus, the polysilicon in the peripheral unit coats the memory cell array unit as a resistor mask, and is removed by wet etching.

Thus, when the polysilicon (98) etching procedure is stopped in the cell array unit at approximately the same height as the gates (specifically, the level of the SiO₁ film (55)), only the part of the selectively remaining polysilicon (98) which is on the contact area of the bit line is covered with a photoresist (99) as shown in FIG. 15. The polysilicon in the other areas is removed by dry and wet etching. Thus, the polysilicon (98) is allowed to remain only in the contact area.

Next, as shown in FIG. 16, CVD is used to apply the Si₃N₄ layer (56) onto the entire surface up to the level of the dashed line, after which the etching back technology is used to etch the Si₃N₄ layer (56), thereby allowing the Si₃N₄ to remain only between the gates (except for the polysilicon layer (98)). It is allowed to remain in the peripheral circuitry unit on the sides of the gates as a side wall (86).

Figure 17A:
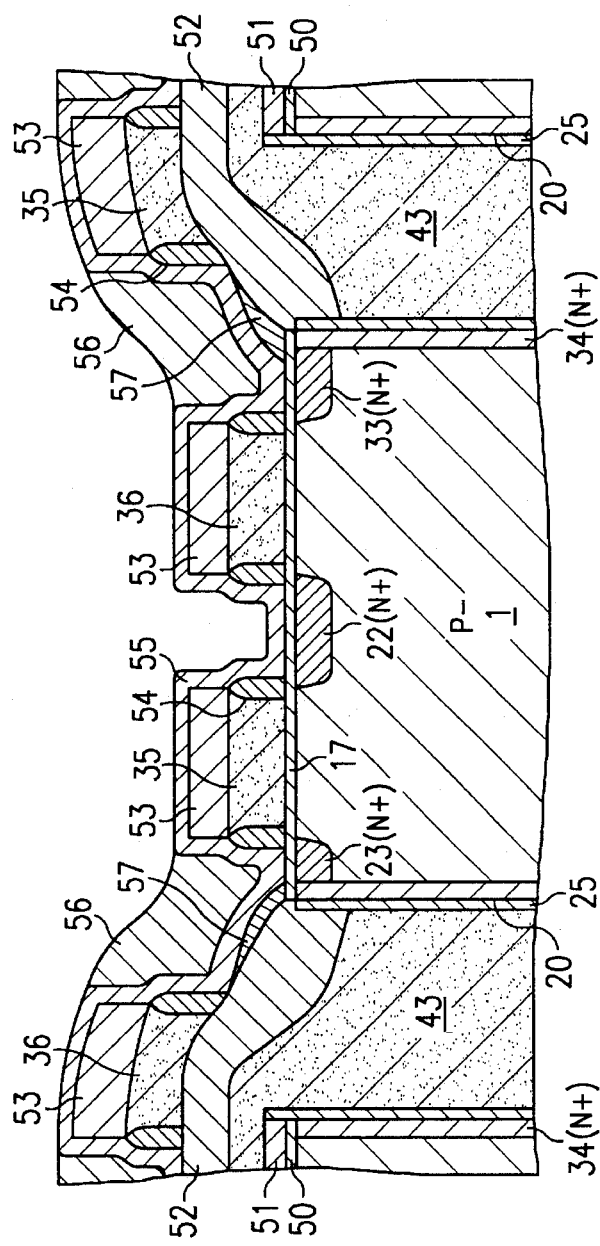
FIGS. 17 and 17B are cross sections of the major parts which shows a step in the method for manufacturing the aforementioned RAM IC.
Figure 17B:
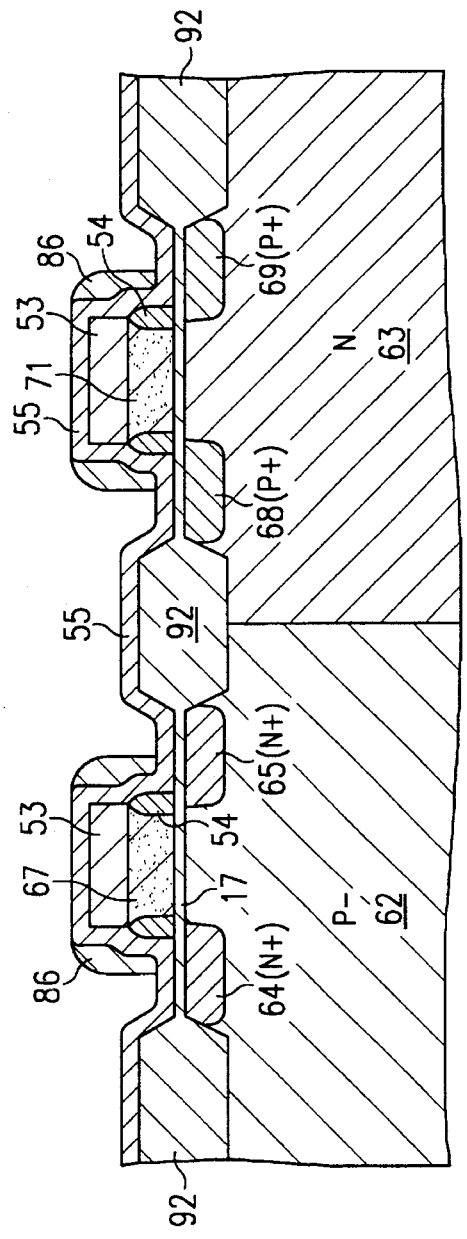

Next, as shown in FIG. 17, wet etching is used to remove only the polysilicon (98). During this process, the polysilicon (98) has a sufficiently higher etching speed ratio than that of the SiO₂ film (55). Thus, the SiO₂ film (55) is not etched off at all.

Figure 18A:
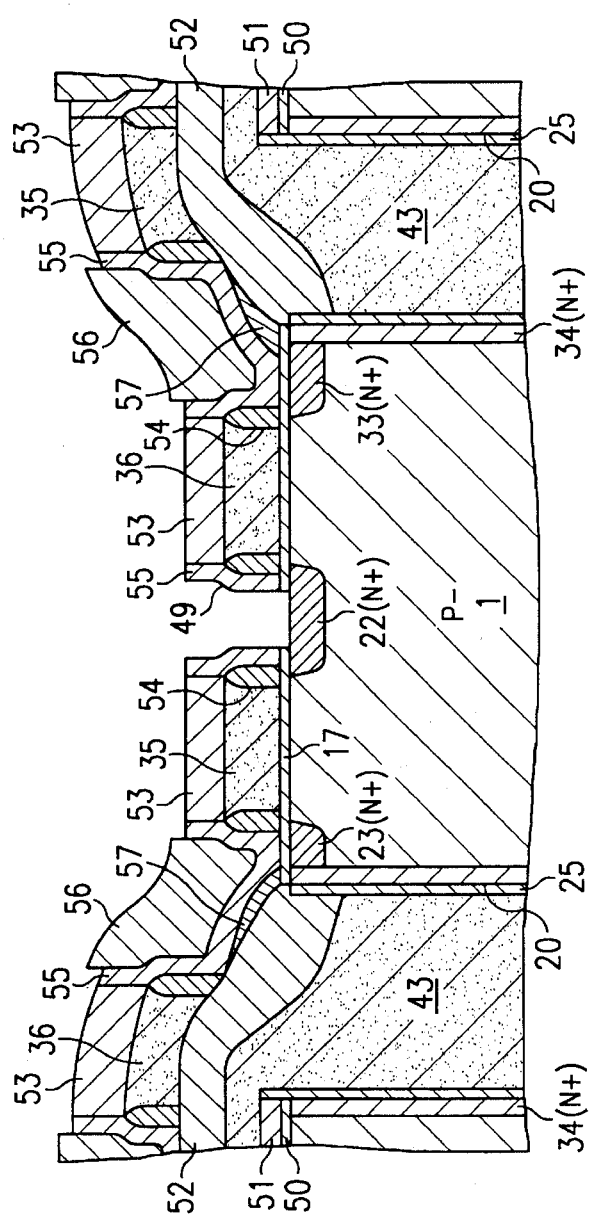
FIGS. 18 and 18B are cross sections of the major parts which shows a step in the method for manufacturing the aforementioned RAM IC.
Figure 18B:
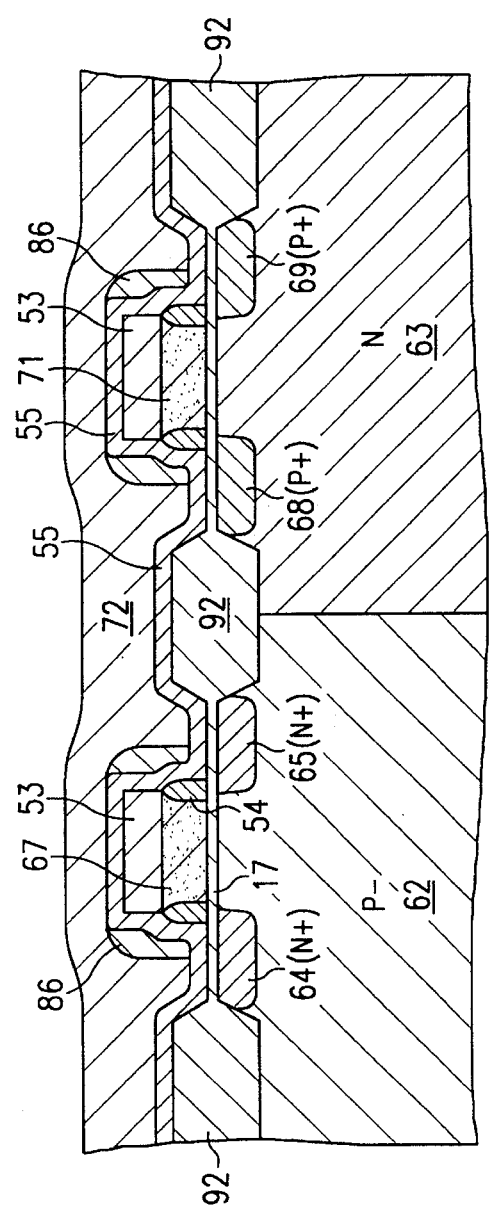
Figure 19:
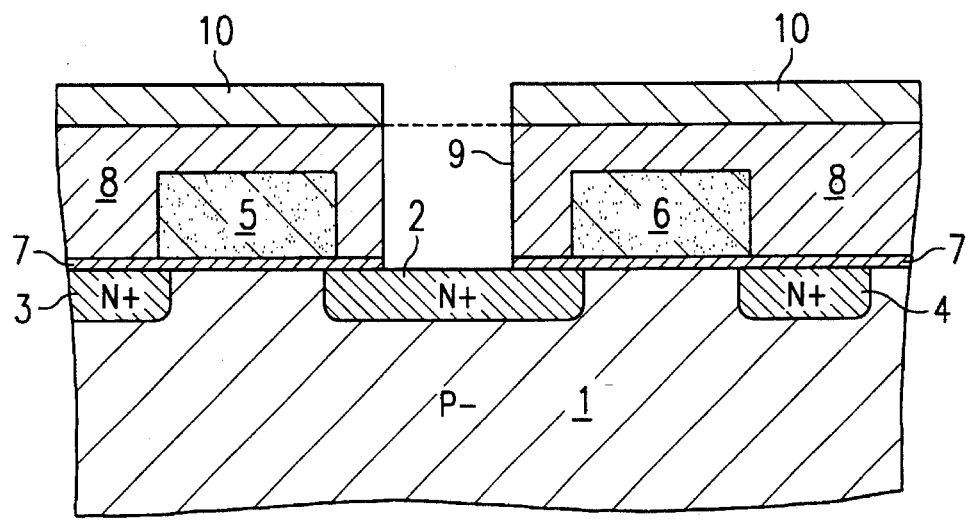
FIG. 19 is a cross section related to a manufacturing procedure for the memory cell unit of the RAM IC of prior art.
Figure 20:
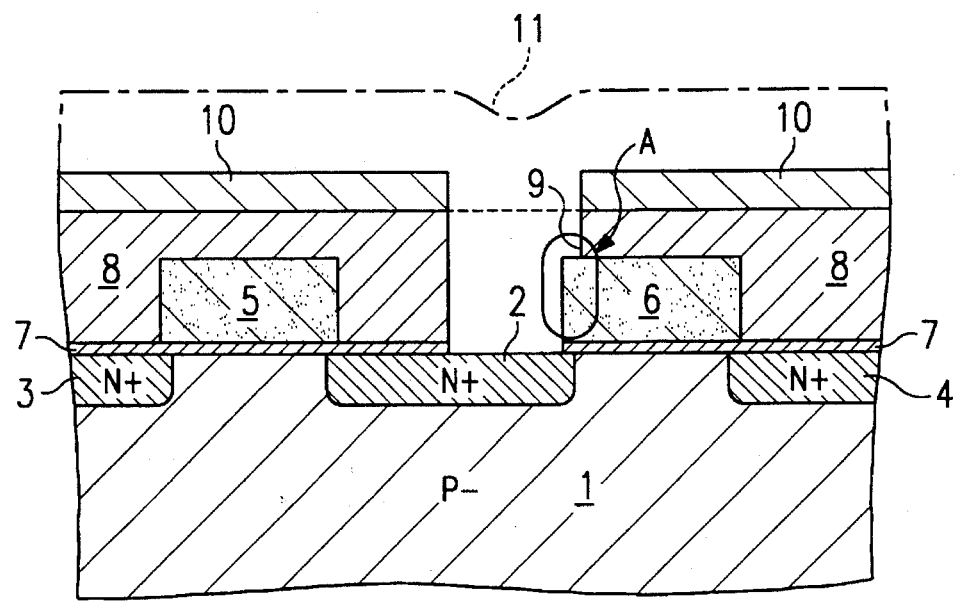
FIG. 20 is a cross section which shows a shift in mask position in the aforementioned memory cell unit.
Figure 21:
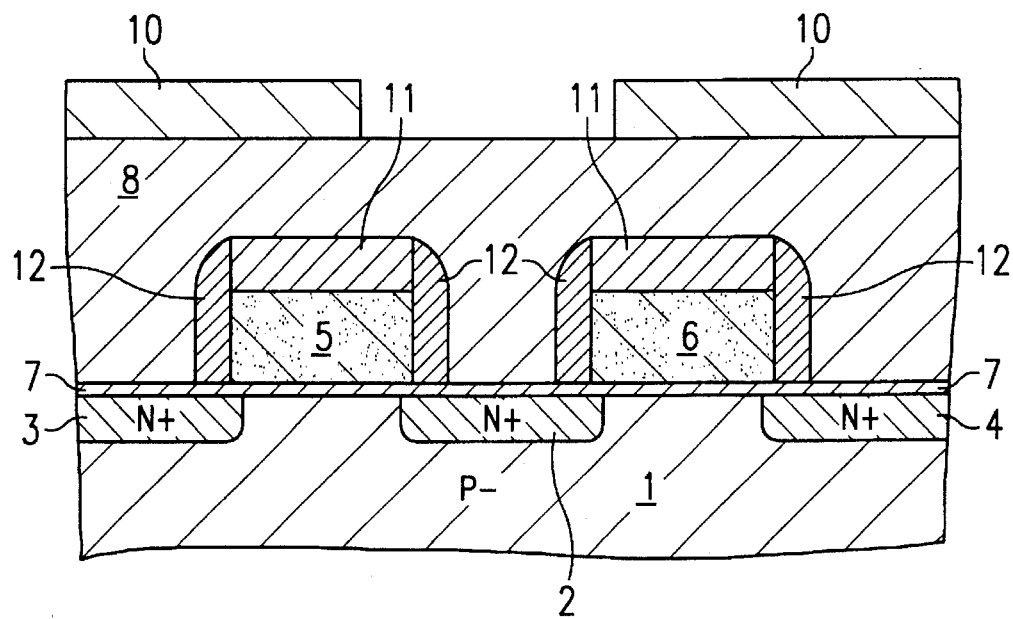
FIG. 21 is a cross section related to a manufacturing procedure for the memory cell unit of the RAM IC of another prior art.

Next, although not shown in the figures, polysilicon is again deposited to the entire surface, the memory cell array unit alone is covered with a resist, and the polysilicon in the peripheral unit is removed. Next, SiO₂ is again deposited, and the peripheral area is now covered with a resist in order to remove the SiO₂ in the memory cell array unit, after which the SiO₂ in the memory cell area unit is removed. Thus, the polysilicon remaining in the memory cell array unit, which has been deposited a second time, is removed by wet etching. FIG. 18 shows the SiO₂ (72) remaining in the peripheral unit. Next, dry etching is carried out on the SiO₂ in the memory cell array unit, thereby removing the SiO₂ film (55) which is on the n⁺-type area (22), to form a contact hole (49). During this process, since dry etching is employed, the SiO₂ film (55) on the SiO₂ layer (53) of the gates is also removed. However, this has essentially no effect on the underlying SiO₂ layer (53). In addition, the SiO₂ film (55) on the gate sides (surrounding the contact hole (49)) is also allowed to remain without being affected.

Next, as shown in FIG. 1, the CVD method is used to deposit a bit line wiring material (such as polysilicon), which is subjected to bit line patterning to connect the bit line (41) to the n⁺-type area (22) through the contact holes (49). It can then be directly connected to the SiO₂ layer (53) of the gates, and to the Si₃N₄ layer (56) between the gates (it is not necessary to install an interlayer insulating film in the memory cell array unit in the conventional manner). In the peripheral circuitry unit, the SiO₂ layers (72) and (55) are etched in the desired locations to form contact holes, which are then covered with wiring material (for (73–76); see FIG. 3).

With the manufacturing method described above, the polysilicon layer (98) is selectively removed in the procedures shown in FIGS. 16 and 17, after which contact holes are formed in the following procedure of FIG. 18. However, since the polysilicon layer (98) is buried between the gates only by the etching back technology, the thickness of the polysilicon layer (98) is relatively thin. In addition, since the etching process is carried out using the gate itself and the Si₃N₄ layer (56) as control means, it is possible for the polysilicon layer (98) etching removal process to be self-aligning without using a mask.

In addition, since polysilicon has an etching rate which is sufficiently greater than that of SiO₂, the SiO₂ film (55) can remain without being etched. In addition, in the procedure shown in FIG. 18, it is possible to carry out the treatment to be self-aligning without a mask, even when dry etching is used to etch the SiO₂ film (55) and form a contact hole (49). Thus, it is possible to leave a sufficient amount of the SiO₂ film (55) on the gate sides.

Thus, with the method of the present example, the problem of mask shifting does not exist since it is possible to form the contact holes (49) of the bit line (41) to be self-aligning. Therefore, it is possible to increase the degree of integration, thereby forming a highly reliable structure with proper insulation between the bit line and word lines.

In addition, differences in etching speed are utilized in the procedure shown in FIG. 17. However, since the polysilicon has a sufficiently higher etching speed than that of the SiO₂, and since the etched thickness is relatively thin (see FIG. 16), the SiO₂ film (55) is not etched.

In addition, during the polysilicon layer (98) etching process (FIG. 17), and the SiO₂ film (55) etching process (FIG. 18), the aforementioned Si₃N₄ layer (56) serves to mask the areas away from the bit line contact areas. In addition, because of its insulating function and because of the flattened surface, it is possible to directly connect the line (41), even in completed devices, thereby making it possible to avoid the use of proper interlayer insulating films.

Although the present invention has been explained with reference to embodiments, it is also possible to alter the aforementioned embodiments in a variety of manners based on the technological ideas of the present invention.

For example, in addition to Si₃N₄, it is possible to use other insulating layers, such as SiO₂ and TaOx, as the aforementioned Si₃N₄ layer (56). As for the gates themselves, it is possible to use the SiO₂ film (55) as an Si₃N₄ film. With an Si₃N₄ film, if the SiO₂ film (54) on the sides of the polysilicon gate electrodes is made thicker, then it is possible to carry out the etching process during the formation of contact holes in FIG. 18 by wet etching.

In addition to the aforementioned polysilicon-SiO₂ combination, it is also possible to use insulating layers other than the SiO₂ layer (53) as a material for constructing the gates, and it is also possible to use electrode materials other than polysilicon.

The aforementioned polysilicon layer (98) is a highly suitable material. Acceptable examples other than that polysilicon which can be wet etched are resist resins and metals such as Al. The materials which can be used in this process should have an etching speed at least 10 times higher than that of $SiO_2$.

In addition, with the aforementioned manufacturing method, it is preferable to carry out wet etching for the etching procedure for the polysilicon shown in FIG. 17, for example, since the selectivity ratio with respect to $SiO_2$ can be increased. However, it is also possible to apply dry etching. Specifically, even with dry etching, it is possible to selectively etch the polysilicon since the etching speed ratio of polysilicon:$SiO_2$ is (10–15):1. In addition, since the polysilicon (98) removed in the etching is relatively thin, it is possible to easily design the conditions such that $SiO_2$ etching can be avoided, even with dry etching, during the polysilicon removal process.

In addition, it is also possible to use the conductive type opposite the conductive type of the aforementioned semiconductor areas (such as changing the p-type well into an n-type well). There are no restrictions on the CMOS type of the peripheral circuitry unit.

With the device described above, a LOCOS structure was applied to the peripheral circuitry unit and a field plate structure was applied to the memory cell array unit. However, it is possible to use other constructions. For example, it is also possible to use a LOCOS structure in the memory cell array. In addition, it is also possible to apply to the capacitors commonly known structures, such as STT (Stacked in Trench), in which the walls of the trench groove are insulated and isolated.

It is of course possible to apply the present invention to semiconductor integrated circuits other than a highly integrated dynamic RAM which have the aforementioned structure. In addition, it is possible to apply the formation method for the contact hole in the aforementioned bit line to a wide range of other devices, and in the formation of contact holes in other locations.

As described above, with the present invention, a third insulator is buried between laminates to approximately the same height. Thus, the surface is flattened, insulation and isolation from the lower area is sufficient, and it is possible to apply the wiring directly. Therefore, wiring formation is easy.

In addition, with the present invention, a material with a high etching speed is allowed to remain between the laminates only in the contact area. Since it is etched, the thickness of the layer of that material is relatively thin and controlled by the laminates and insulating layers between the laminates during etching. Thus, it is possible to carry out self-aligning etching without a mask.

After the etching procedure, the insulating film remaining on the sides of the laminates is again subjected to etching to remove only its bottom, thereby making it possible to etch the contact holes to be self-aligning. Thus, it is possible to achieve highly reliable contacts without short-circuits and without shifting in mask position.

What is claimed is:

1. A method of making a semiconductor device comprising:

providing a semiconductor substrate of one conductivity type and having a top surface;

forming doped regions having a dopant impurity of the other conductivity type in the semiconductor substrate of said one conductivity type in spaced relation to each other and opening onto the top surface of the semiconductor substrate;

forming a first insulation layer on the top surface of the semiconductor substrate of said one conductivity type;

forming a first layer of electrically conductive material over the first insulation layer;

forming a second insulation layer over the first electrically conductive layer;

defining laminate structures from the first layer of electrically conductive material and the second insulating layer so as to provide at least respective first and second laminate structures of electrically conductive material and overlying insulation material in stacked relationship on the first insulation layer and spaced from each other to provide an exposed portion of the first insulation layer overlying the semiconductor substrate;

forming a third insulation layer covering only the sides of the first layer of electrically conductive material included in the first and second laminate structures;

forming a fourth insulation layer overlying the first and second laminate structures and covering the sides thereof so as to overlie said third insulation layer and lying between the first and second laminate structures so as to cover the exposed portion of the first insulation layer;

removing the portion of the fourth insulation layer lying between the first and second laminate structures, and also removing the underlying portion of the first insulation layer to expose a portion of at least one of the doped regions of the other conductivity type in the semiconductor substrate of said one conductivity type and opening onto the top surface thereof; and forming a second layer of electrically conductive material over the second insulation layer included in the first and second laminate structures and into the space between the first and second laminate structures to connect with the at least one exposed doped region of the other conductivity type located therebetween.

2. A method of making a semiconductor device as set forth in claim 1, wherein the formation of said doped regions having a dopant impurity of the other conductivity type in the semiconductor substrate of said one conductivity type occurs after the formation of the first insulation layer, the first layer of electrically conductive material, and the second insulation layer in sequential order on the top surface of the semiconductor substrate of said one conductivity type.

3. A method of making a semiconductor device as set forth in claim 2, wherein the formation of said doped regions having a dopant impurity of the other conductivity type is accomplished by selective ion implantation of the dopant impurity of said the other conductivity type at spaced locations into the semiconductor substrate of one conductivity type.

4. A method of making a semiconductor device as set forth in claim 3, wherein the selective ion implantation of the dopant impurity of the other conductivity type at spaced locations into the semiconductor substrate of said one conductivity type is accomplished by ion implantation of the dopant impurity of the other conductivity type through the first insulation layer using the first and second laminate structures as masks to provide self-aligned doped regions of the other conductivity type in the semiconductor substrate of said one conductivity type.

5. A method of making a semiconductor device as set forth in claim 1, further including providing a layer of an etchable material overlying the entire structure including said first and second laminate structures and the space between said first and second laminate structures prior to the removal of the portion of the fourth insulation layer lying between said first and second laminate structures; and etching the layer of etchable material to an extent retaining a predetermined thickness of the etchable material filling the space between said first and second laminate structures and having substantially the same height as said first and second laminate structures and said fourth insulation layer overlying said laminate structures;

masking the portion of the retained layer of etchable material disposed in the space between said first and second laminate structures;

removing the retained layer of etchable material in areas other than the space between said first and second laminate structures.

6. A method of making a semiconductor device as set fifth in claim 5, further including applying a fourth insulation layer onto the first and second laminate structures, the overlying third insulation layer, and the retained layer of etchable material in the space between said first and second laminate structures;

removing the fifth insulation layer to an extent retaining a remaining portion of the fifth insulation layer between said first laminate structure and another laminate structure arranged in spaced relationship with respect thereto and between said second laminate structure and another laminate structure arranged in spaced relation with respect thereto; and removing the retained layer of etchable material in the space between said first and second laminate structures such that the portion of the third insulation layer lying in the space between said first and second laminate structures is uncovered.

7. A method of making a semiconductor device as set forth in claim 6, wherein the etchable material provided to fill the space between said first and second laminate structures has a higher etching rate than the etching rate of said fourth insulation layer;

the removal of the etchable material filling the space between the first and second laminate structures is accomplished by a first etching procedure; and then removing the portion of said fourth insulation layer lying between said first and second laminate structures by a second etching procedure.

8. A method of making a semiconductor device as set forth in claim 1, wherein the forming of doped regions having a dopant impurity of the other conductivity type in the semiconductor substrate of said one conductivity type provides at least a drain region and respective source regions on opposite sides thereof opening onto the top surface of the semiconductor substrate; and the forming of the second layer of electrically conductive material over the second insulation layer included in the first and second laminate structures and into the space between the first and second laminate structures provides a connection with the drain region common to the source regions on opposite sides thereof.

\* \* \* \* \*